(12) United States Patent
Jones et al.

(10) Patent No.: US 12,087,803 B2
(45) Date of Patent: *Sep. 10, 2024

(54) IMAGING IN CURVED ARRAYS: METHODS TO PRODUCE FREE-FORMED CURVED DETECTORS

(71) Applicant: California Institute of Technology, Pasadena, CA (US)

(72) Inventors: Todd J. Jones, Altadena, CA (US); Shouleh Nikzad, Valencia, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/955,679

(22) Filed: Sep. 29, 2022

(65) Prior Publication Data

US 2023/0146048 A1 May 11, 2023

Related U.S. Application Data

(63) Continuation of application No. 17/027,495, filed on Sep. 21, 2020, now Pat. No. 11,600,655.

(60) Provisional application No. 62/902,563, filed on Sep. 19, 2019.

(51) Int. Cl.
| | |
|---|---|
| *H01L 27/146* | (2006.01) |
| *H01L 27/148* | (2006.01) |
| *H01L 31/0392* | (2006.01) |

(52) U.S. Cl.
CPC .. *H01L 27/14875* (2013.01); *H01L 27/14683* (2013.01); *H01L 31/03926* (2013.01)

(58) Field of Classification Search
None
See application file for complete search history.

(56) References Cited

U.S. PATENT DOCUMENTS

| | | | |
|---|---|---|---|
| 8,742,325 B1 | 6/2014 | Droz et al. | |
| 11,600,655 B2 * | 3/2023 | Jones | H01L 27/1467 |
| 2005/0109918 A1 | 5/2005 | Nikzad et al. | |
| 2015/0309285 A1 | 10/2015 | Ishihara | |
| 2016/0240582 A1 | 8/2016 | Yamamoto et al. | |
| 2018/0076257 A1 | 3/2018 | McKnight et al. | |

* cited by examiner

*Primary Examiner* — Benjamin P Sandvik
(74) *Attorney, Agent, or Firm* — GATES & COOPER LLP

(57) ABSTRACT

A detector including a detector membrane comprising a semiconductor sensor and a readout circuit, the detector membrane having a thickness of 100 micrometers or less and a curved surface conformed to a curved focal plane of an optical system imaging electromagnetic radiation onto the curved surface; and a mount attached to a backside of the detector membrane. A maximum of the strain experienced by the detector membrane is reduced by distribution of the strain induced by formation of the curved surface across all of the curved surface of the detector membrane, thereby allowing an increased radius of curvature of the curved surface as compared to without the distribution.

20 Claims, 24 Drawing Sheets

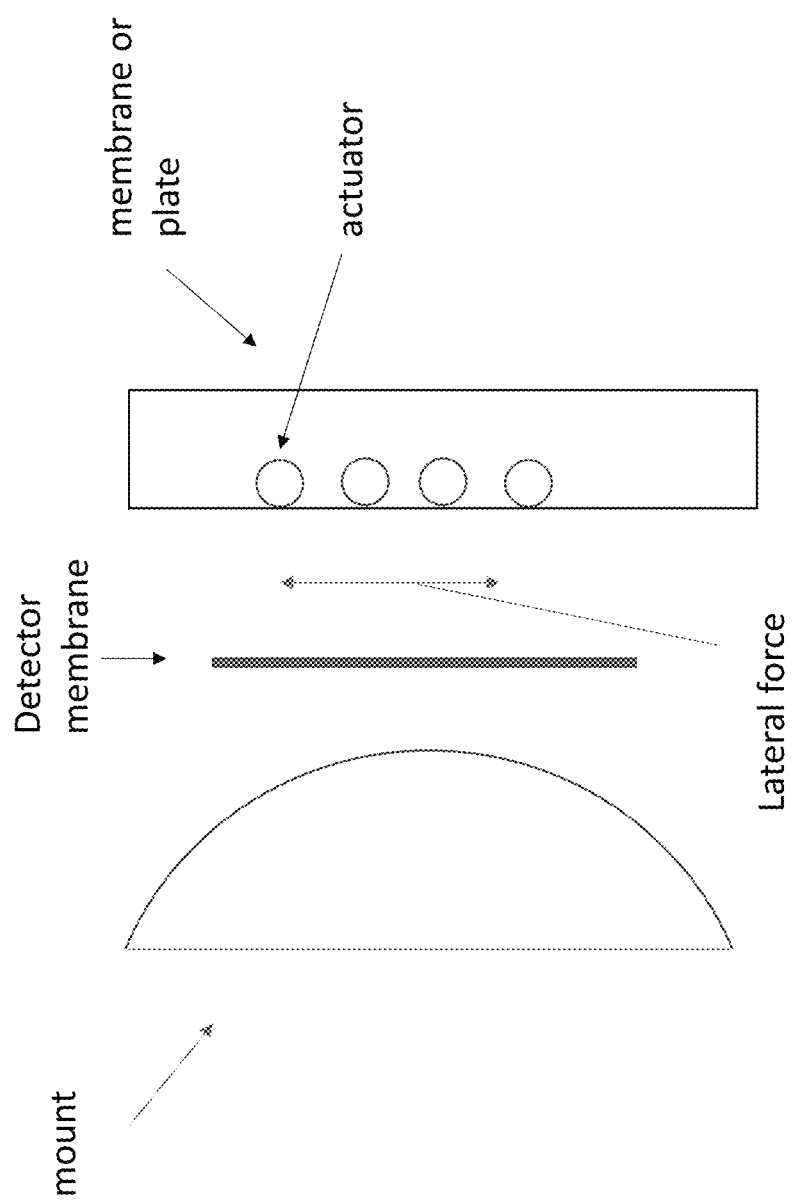

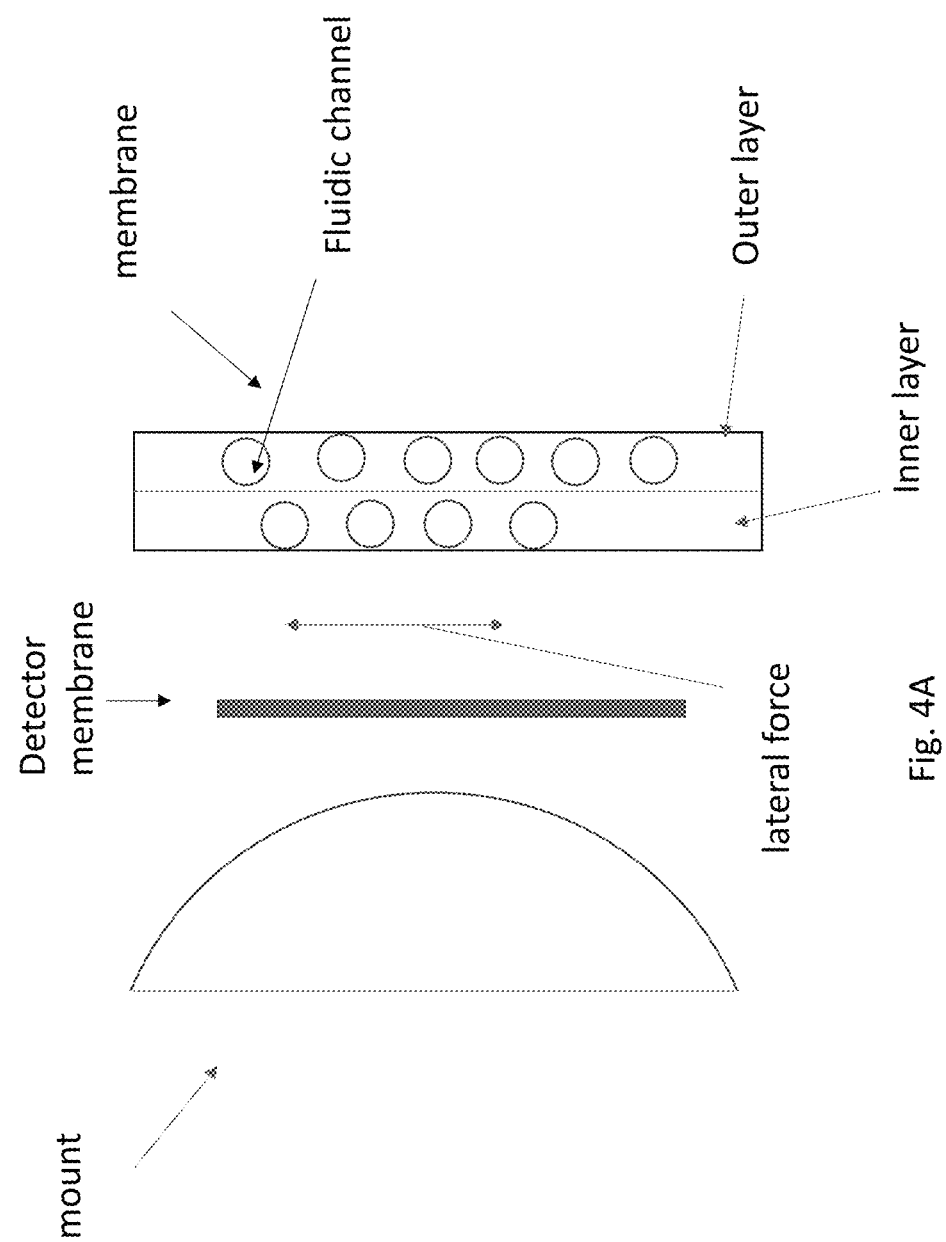

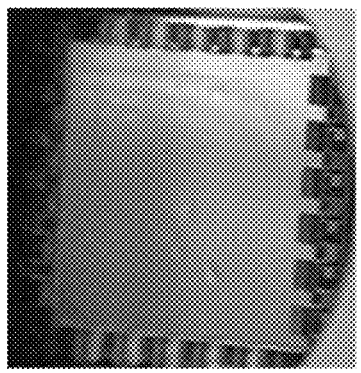
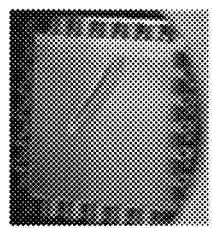
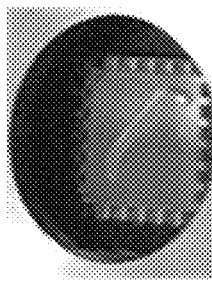
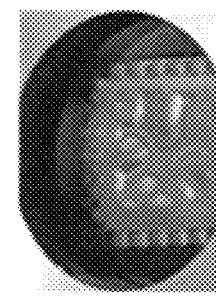
Fig. 4C
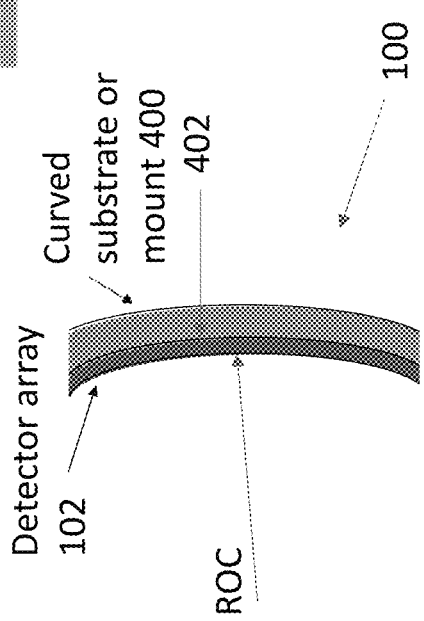
Fig. 4E
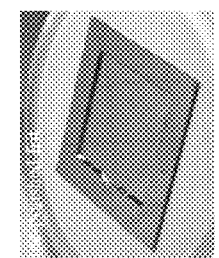
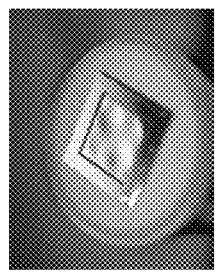
Fig. 4D

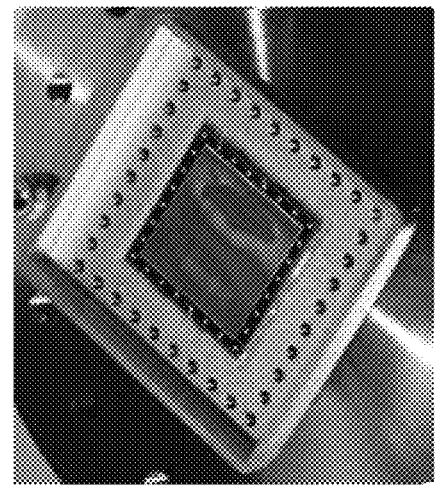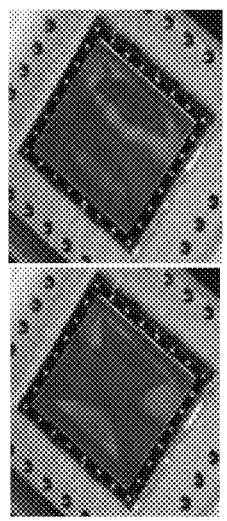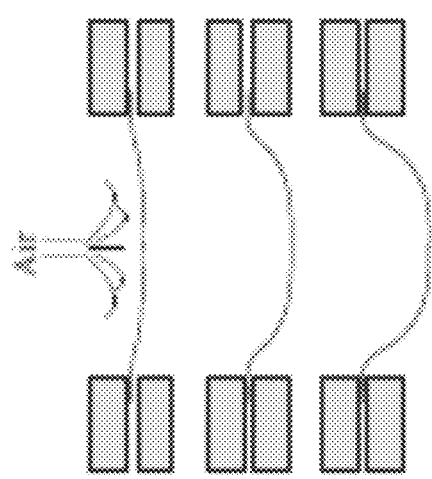
Fig. 10

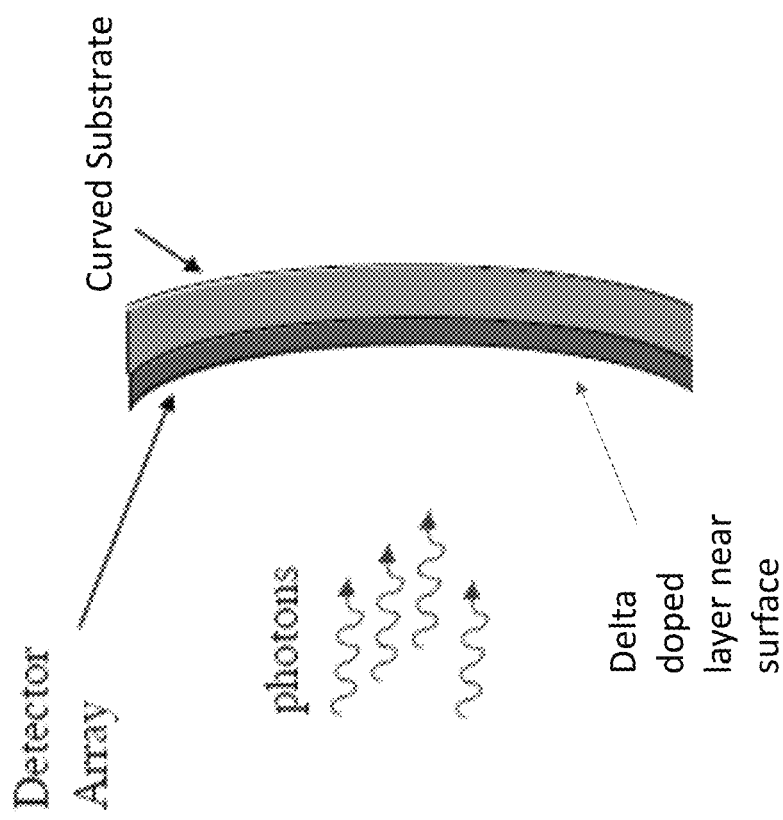

IMAGING IN CURVED ARRAYS: METHODS TO PRODUCE FREE-FORMED CURVED DETECTORS

CROSS REFERENCE TO RELATED APPLICATIONS

'This application is a divisional under 35 U.S.C. § 121 of U.S. Utility patent application Ser. No. 17/027,495, filed on Sep. 21, 2020, which application claims the benefit under 35 USC 119(e) of commonly assigned U.S. Provisional Patent Application Ser. No. 62/902,563, filed Sep. 19, 2019, by Todd J. Jones and Shouleh Nikzad, entitled "IMAGING IN CURVED ARRAYS: METHODS TO PRODUCE SPHERICALLY CURVED DETECTORS," (CIT-8346-P), both of which applications are incorporated by reference herein.

STATEMENT REGARDING FEDERALLY SPONSORED RESEARCH AND DEVELOPMENT

This invention was made with government support under Grant No. 80NM0018D004 awarded by NASA (JPL). The government has certain rights in the invention.

BACKGROUND OF THE INVENTION

1. Field of the Invention

The present disclosure relates to detectors and methods of making the same.

2. Description of the Related Art

Conventional infrared imaging cameras are bulky due to complicated optics required to flatten their focal plane, as illustrated in FIG. 1A. The ability to curve the detector array eliminates most of the optical components making up that bulk. However, conventional attempts to curve detector membranes are limited to pneumatic forming or direct contact with forceful molds. These methods cause high stresses which limit the degree of curvature of the detector array. What is needed are improved methods for conforming the detector array to the focal plane without imparting undesirable strain to the detector array. The present invention satisfies this need.

SUMMARY OF THE INVENTION

Devices and methods according to embodiments described herein include, but are not limited to, the following.

1. A detector, comprising:
   a detector membrane comprising a semiconductor sensor and a readout circuit, the detector membrane having a thickness of 100 micrometers or less and a curved surface conformed to a curved focal plane of an optical system imaging electromagnetic radiation onto the curved surface; and
   a mount attached to a backside of the detector membrane; wherein:
   a maximum of the strain experienced by the detector membrane is reduced by distribution of the strain induced by formation of the curved surface across all of the curved surface of the detector membrane, thereby allowing an increased radius of curvature of the curved surface, and
   the semiconductor sensor converts photons to charged particles and the readout circuit measures a quantity of the charged particles, the semiconductor comprises an elemental semiconductor or compound semiconductor and the readout circuit is integrated with the semiconductor sensor monolithically or in a hybrid fashion.

2. The detector of example 1, wherein an adhesion between the mount and the detector membrane distributes the strain.

3. The detector of example 1 or 2, wherein the semiconductor comprises silicon or a group III-V semiconductor, II-VI semiconductor, and the focal plane array detects electromagnetic radiation having a wavelength in a range of 400 nm-16 microns.

4. The detector of example 1, 3, or 3 wherein:
   the detector membrane has a radius of curvature of 50 mm or less, and
   the curved surface has an area receiving electromagnetic radiation of at least 400 millimeters.

5. The detector of one or any combination of the claims 1-3, wherein the curved surface is spherical, parabolic, elliptical, or custom designed shape.

6. A wearable infrared imager or a camera comprising the detector of any of the claims 1-4.

7. A detector, comprising:
   a detector membrane comprising a semiconductor sensor and a readout circuit, the detector membrane having a thickness of 100 micrometers or less and a curved surface conformed to a curved focal plane of an optical system imaging electromagnetic radiation onto the curved surface; wherein:
   the semiconductor sensor converts photons to charged particles and the readout circuit measures a quantity of the charged particles, the semiconductor comprises an elemental semiconductor or compound semiconductor and the readout circuit is integrated with semiconductor sensor monolithically or in a hybrid fashion;
   the detector membrane a radius of curvature of 50 mm or less; and
   the curved surface has an area of at least 400 millimeters squared.

8. A method of making a curved detector, comprising:
   obtaining a detector membrane comprising a semiconductor having a thickness less than 100 microns;
   applying one or more forces at a plurality of locations on the detector membrane and in one or more directions, the one or more forces deforming the detector membrane so as to form a curved surface of the detector membrane, wherein:
   the forces applied in one direction are applied a frictionless manner with no friction between the detector membrane and the actuator applying the forces, or
   when the one or more directions include a plurality of directions, the directions include one or more lateral directions in a tangential plane of a surface of the detector membrane;
   progressively attaching the detector membrane to a mount as the forces are applied so that the mount sustains or supports a majority of the strain, wherein the detector membrane is adhered to an adhesive on a surface of the mount, the surface having the desired/designed/target radius of curvature of the curved surface.

9. The method of example 8, further comprising physically contacting the detector membrane to a flexible actuator membrane generating the forces and applying the one or more forces to the detector membrane via a physical contact between the actuator membrane and the detector membrane.

10. The method of example 9, wherein:
the flexible actuator membrane comprises a plurality of concentric conductors in a plane of the flexible actuator membrane, and
applying the forces comprises:
passing an electrical current in the conductors, and
applying a magnetic field to induce a Lorentz force on the conductors that laterally stretches or contracts the flexible actuator membrane, thereby delivering through the physical contact the one or more forces comprising a radial force inwards or outwards.

11. The method of example 9, wherein:
the flexible actuator membrane comprises two layers each including a plurality of concentric fluidic channels in a plane of the flexible actuator membrane; and
applying the forces comprises controlling a pressure of a fluid in the fluidic channels causing the flexible actuator membrane to expand or contract, thereby delivering through the physical contact the one or more forces comprising a radial force inwards or outwards.

12. The method of example 8, further comprising:
physically contacting the detector membrane with a flexible actuator or flexible actuator membrane (e.g., bimetallic plate) comprising at least two materials having different coefficients of thermal expansion; and
heating and/or cooling the flexible actuator membrane to a plurality of temperatures causing the bimetallic plate to deform and applying the one or more forces to the detector membrane via a physical contact between the bimetallic plate and the detector membrane.

13. The method of example 8, wherein applying the forces comprises sequentially heating or cooling the detector membrane while progressively attaching the detector membrane to the mount having the desired radius of curvature, so as to seize the detector membrane upon the surface of the mount when the detector membrane is thermally stressed to an optimal strain for a given region of contact between the detector membrane and the mount.

14. The method of example 8, further comprising applying a heat shrinking polymer to the detector membrane, wherein applying the forces comprises warming, to various degrees, only those regions of the detector membrane of specified radius from the center of the detector membrane.

15. The method of example 8, further comprising applying the one or more forces using concentrically arrayed piezo electric actuators on a flexible material, wherein:
the piezo electric actuators are set against a stiff platform at one end opposite the detector membrane and are attached to the detector membrane at the other of their ends, and
the flexible material between the piezo electric actuators allows the piezo electric actuators to tilt laterally during their longitudinal deformations.

16. The method of example 8, further comprising:
physically contacting a nested set of concentric cylinders to the detector membrane, the cylinders each having a different radius; and
displacing each of the cylinders against the detector membrane so that the cylinders transfer the one or more forces deforming the detector membrane with increasing extent with larger radius of cylinder.

17. The method example 16, wherein the nested cylinders are gradually displaced with a curved profile.

18. The method of example 8, further comprising progressively attaching the detector membrane to the mount using a frame supporting an elastomer, the elastomer patterned with fingers or a web and the fingers or the web providing a reversible soft contact between the detector membrane and the frame.

19. The method of example 18, further comprising:
(a) depositing the elastomer on the detector membrane;
(b) lithographically patterning the elastomer with the web or finger structures, wherein the patterned elastomer is supported in a frame; and 20. The method of any of the claims 7-18 further comprising manipulating the detector membrane using the frame while the detector membrane is being deformed using one or more different methods.

21. The method of example 7, wherein the curved surface is formed using a combination of the methods of claims 8-17.

22. An apparatus, comprising:
an actuator having structures (e.g., piezo actuators, concentric conductors, fluidic channels, nested cylinders) positioned to apply one or more forces at a plurality of locations on the detector membrane and in one or more directions, the one or more forces deforming the detector membrane so as to form a curved surface of the detector membrane, wherein:
the forces applied in one direction are applied a frictionless manner with no friction between the detector membrane and the actuator applying the forces, or
when the one or more directions include a plurality of directions, the directions include one or more lateral directions in a tangential plane of a surface of the detector membrane; and
a mount positioned to progressively attach to the detector membrane as the forces are applied so that the mount sustains or supports a majority of a strain induced in the detector membrane by the forces, wherein the detector membrane is attached to a surface of the mount having a radius of the curved surface.

BRIEF DESCRIPTION OF THE DRAWINGS

Referring now to the drawings in which like reference numbers represent corresponding parts throughout:

FIG. 1A-1B. Comparison of state-of-the-art flat imagers to curved imagers, wherein FIG. 1A illustrates a flat imager and FIG. 1B illustrates a curved imager according to one or more embodiments described herein.

FIG. 2. Schematic illustrating an apparatus for manufacturing a curved imager.

FIG. 3A-3B. Schematics illustrating the apparatus for making a curved imager using a magnetic field, wherein FIG. 3A is a side view and FIG. 3B is a top view of the actuator membrane.

FIG. 4A-4E. Schematics illustrating the apparatus for making a curved imager using a pressure or vacuum conforming, wherein FIG. 4A is a side view, FIG. 4B is a top view of the actuator membrane, FIG. 4C shows the evolution of CCD flatness using pressure conforming, FIG. 4D shows the evolution of flatness using vacuum conforming and FIG. 4E shows the resulting detector array on a curved substrate.

FIG. 6A-6C. Schematic illustrating the apparatus for making a curved imager using cylinders, wherein FIG. 6A is a side view, FIG. 6B is a top view, and FIG. 6C is a perspective view.

FIG. 10. Schematic illustrating the apparatus for making a curved imager using air pressure.

FIG. 15A-15B illustrates curved detector arrays characterized in FIG. 15, wherein FIG. 15A is a top view and FIG. 15B is a side view schematic.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

1. Example Imager

Figure 1A:
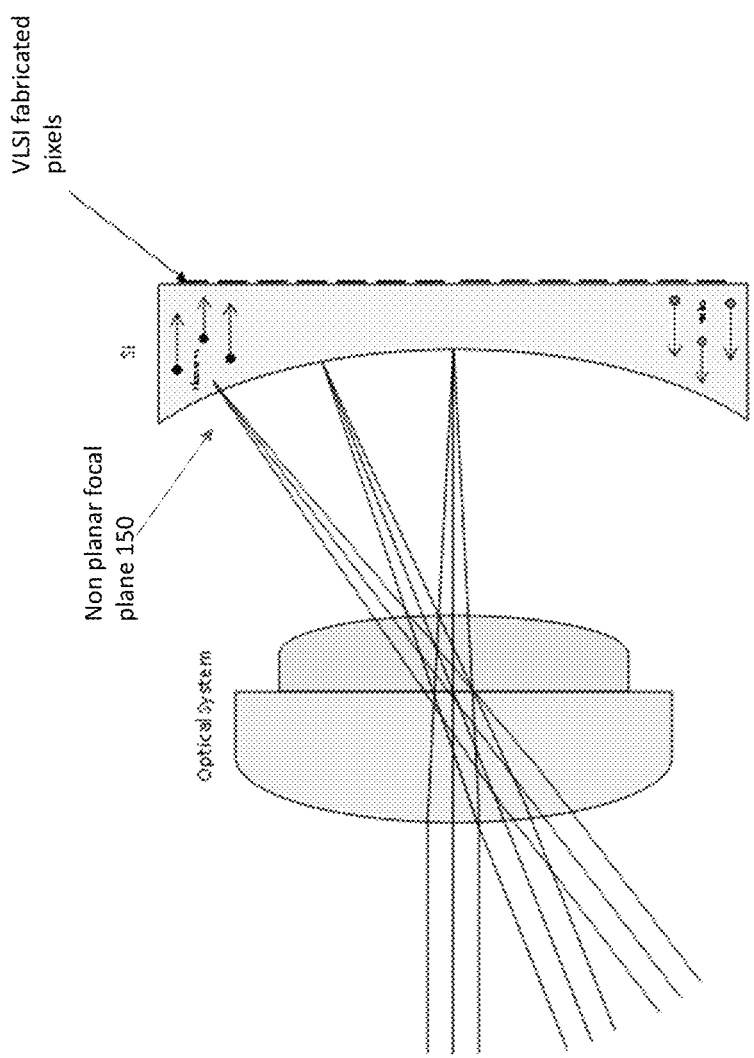
Figure 1B:
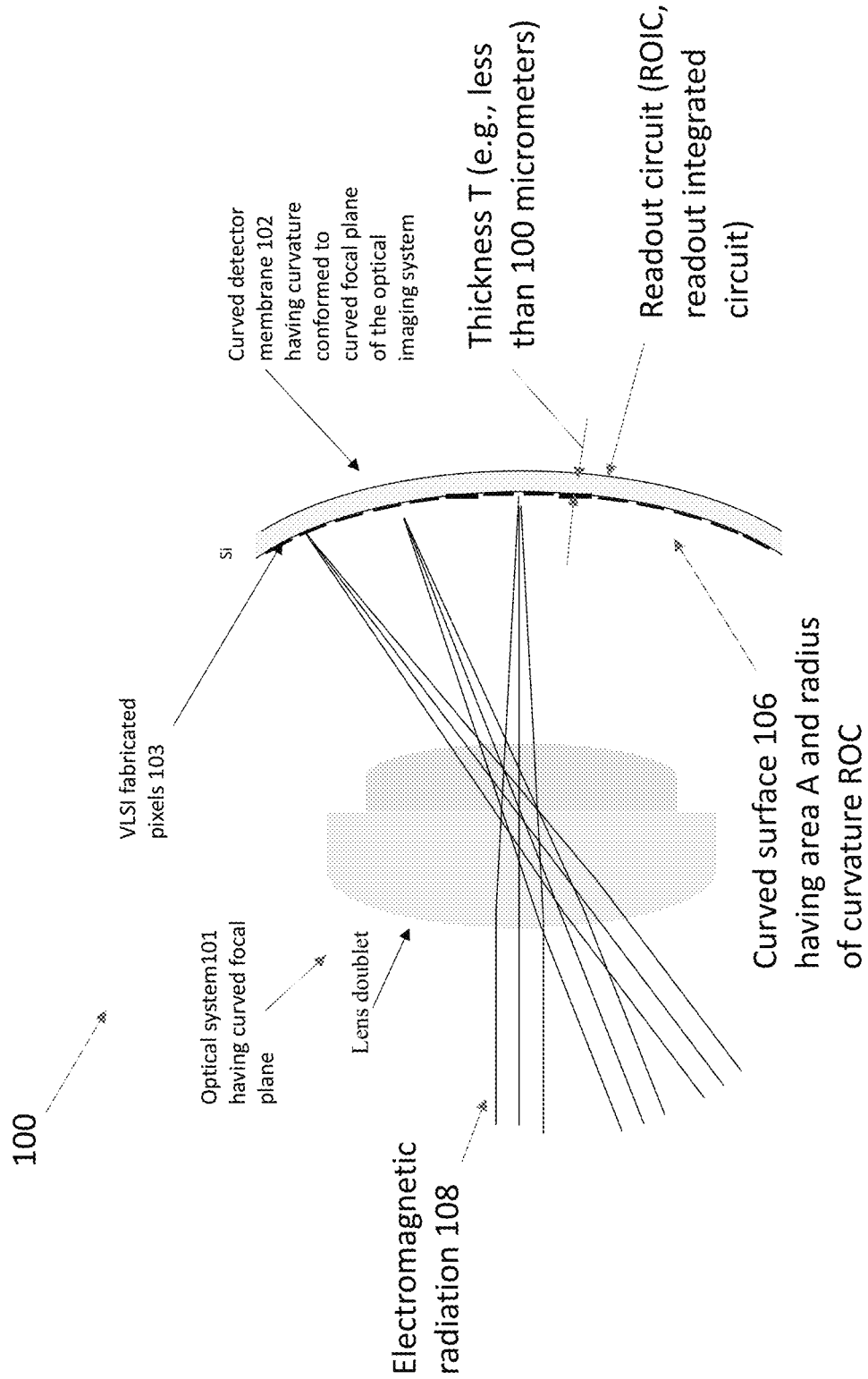

FIG. 1B illustrates an imager 100 comprising an optical system 101 having a non-planar focal plane 150, and a detector membrane 102. The detector membrane comprises a semiconductor comprising a sensor 103 (semiconductor sensor), optionally a readout circuit, and a free-form or curved surface 106 conformed to or matched to a curved focal plane 150 of the optical system imaging electromagnetic radiation 108 onto the curved surface. In one or more examples, the detector membrane has a thickness T of 100 micrometers or less (e.g., in a range of 1-100 micrometers).

FIG. 4E illustrates the imager further comprises a mount 400 attached to a backside 402 of the detector membrane; wherein a maximum of the strain experienced by the detector membrane is reduced by distribution of the strain, induced by formation of the curved surface, across all of the curved surface of the detector membrane, thereby allowing an increased radius of curvature of the curved surface as compared to without the distribution.

The sensor (or semiconductor sensor) converts photons to charged particles and the readout circuit measures a quantity of the charged particles. The readout circuit is integrated with semiconductor sensor monolithically or in a hybrid fashion. In one or more examples, a readout circuit integrated in a hybrid fashion means the readout circuit is manufactured separately or as a separate element or component and then mated or attached to the semiconductor sensor. In one or more examples, the readout circuit converts charge to voltage.

The semiconductor or semiconductor sensor comprises or consists essentially of an elemental semiconductor (e.g., silicon) or compound semiconductor (e.g., group II-VI semiconductor). For example, the semiconductor may comprise/consist essentially of at least one of silicon, a group III-V semiconductor, or group II-VI semiconductor. The sensor may detect electromagnetic radiation having a wavelength in a range of 400 nm-16 microns.

In various examples, the adhesion between the mount and the detector membrane distributes the strain.

In one or more examples, the detector membrane has a radius of curvature of 50 mm or less; and the curved surface has an area of at least 400 millimeters squared.

2. Example Manufacturing Method and Apparatus

The present disclosure further describes methods and systems for manufacturing curved detector arrays (or detector arrays having surfaces conformed to any desired focal plane shape). In a first step, a semiconductor comprising a detector chip and any hybridized readout chips is thinned. Depending on the required radius of curvature, the final thickness can be a membrane less than 50 micrometers thick. The membranes are fragile and cannot sustain significant strain. Thus, the production of a curve membrane depends on delivering the forces needed to shape the brittle membrane in a way that does not exceed the strain limit of the semiconductor crystal which the detector is made of.

FIGS. 2-10 illustrate a method of making a curved detector, comprising (a) obtaining (or thinning) a detector membrane 102 comprising a semiconductor having a thickness less than 100 microns; applying one or more forces at a plurality of locations on the detector membrane and in one or more directions, the one or more forces deforming the detector membrane so as to form a curved surface of the detector membrane; and progressively attaching the detector membrane to a mount as the forces are applied so that the mount sustains or supports a majority of the strain. The detector membrane is adhered to an adhesive on a surface of the mount, and the surface of the mount has the desired/designed/target radius of curvature of the curved surface. In one or more examples, the curved surface (and the surface of the mount) comprise a spherical surface, e.g., a section of surface of a sphere, a parabolic surface, or an elliptical surface, or custom designed shape.

In various examples, the adhesive 306 on the mount is selectively photoactivated at different regions of the mount in order to achieve the progressive attachment/adhesion between the detector membrane and the mount. In various examples, the photoactivated adhesive is photoactivated by shining electromagnetic radiation through the mount that is transparent.

In one or more examples, the forces applied are applied in one direction and are applied a frictionless manner with no friction between the detector membrane and the actuator applying the forces (e.g., using a lubricant or the naturally frictionless surfaces of the detector and actuator). In other examples, when the one or more directions include a plurality of directions, the directions include one or more lateral directions in a tangential plane of a surface of the detector membrane.

FIG. 2 further illustrates an apparatus for making a curved or conformal detector, comprising an actuator 300 or plate including structures 302 for applying the one or more forces to the detector membrane. The structures are actuated and positioned so that the forces form a curved surface of the detector membrane (or a surface conformed or matched to the focal plane of the imager). FIG. 2 further illustrates the mount 400 positioned or configured to progressively or gradually attach to the detector membrane as the forces are applied.

In one or more examples, the lateral forces are increased as a function of increasing radial distance from the center of the detector membrane.

In one or more examples, thinned membranes can be conformed to substrates for flat or curved focal planes or free form surfaces and real time adjustment of curvature is possible with no substrate attachment.

3. Example Manufacturing Methods

Figure 3A:
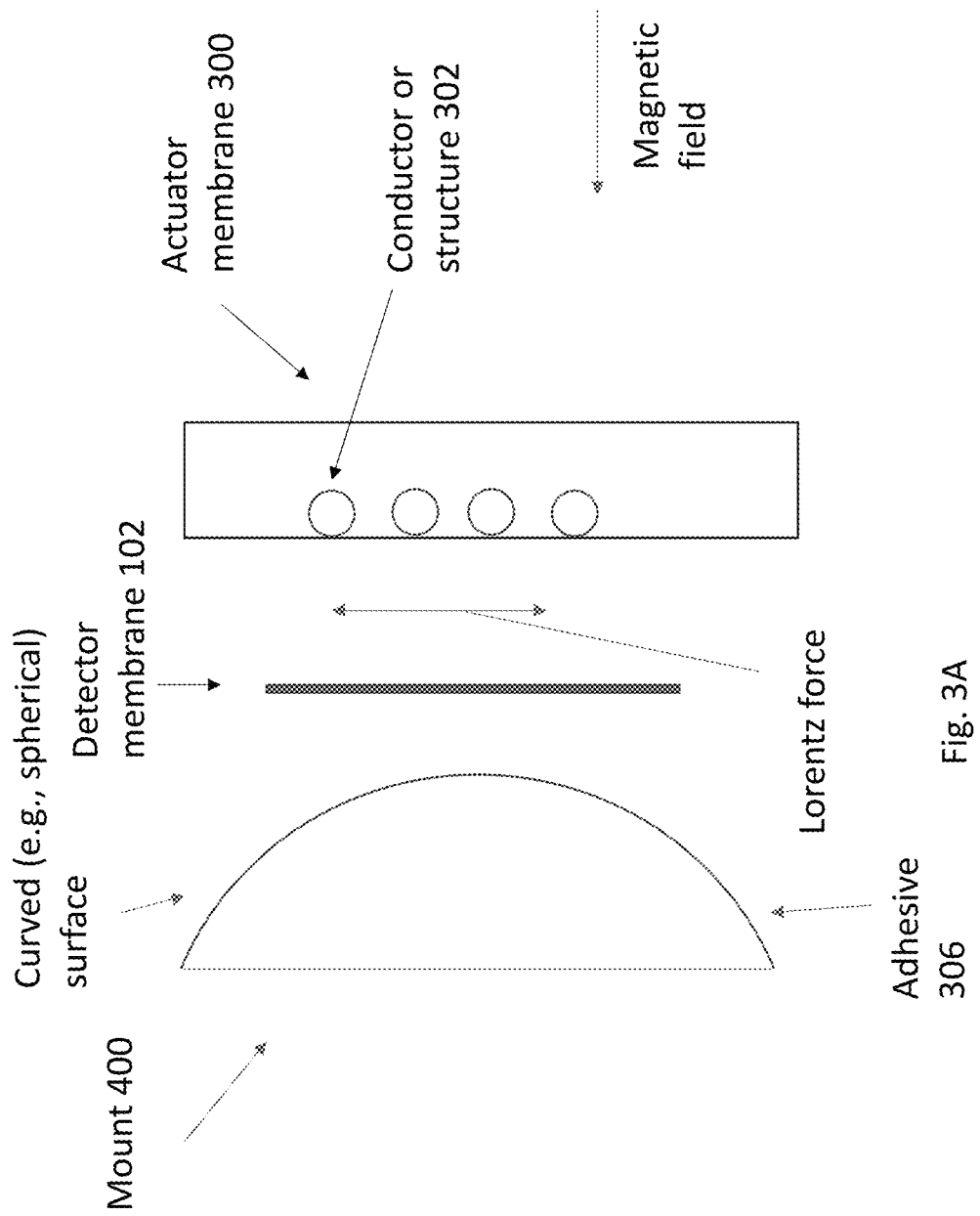
Figure 3B:
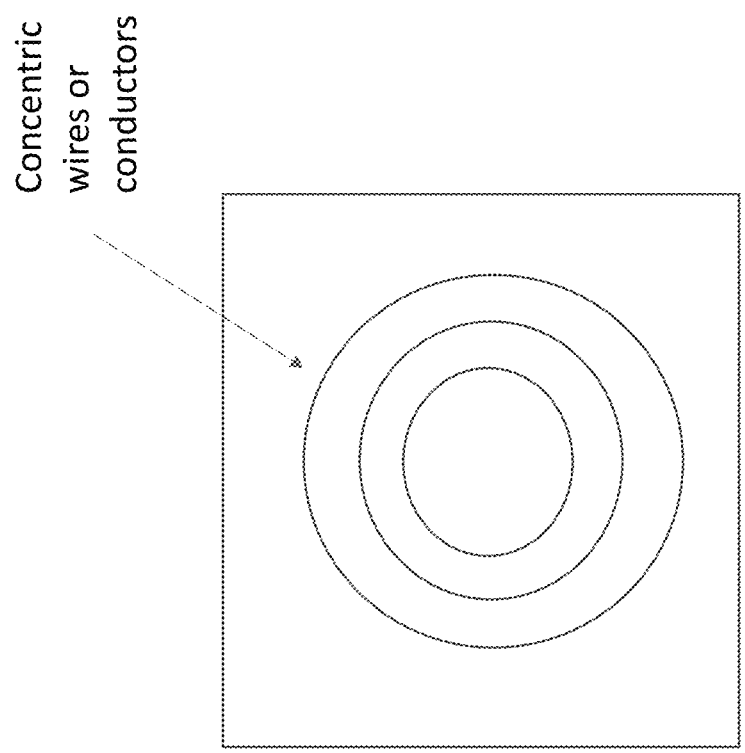

FIGS. 3A and 3B illustrate an example wherein the curvature is attained by attaching the detector membrane to a flexible actuator membrane comprising the structures including embedded concentric conductors (e.g., traces). An intense perpendicular magnetic field drives the current carrying concentric conductors laterally to stretch or contract the detector membrane (according to principle of a Lorentz force on a wire). Similar flexible conductor membrane structures have been used in loudspeaker designs, such as the Heil Air-Motion Transformer. In one or more examples, the current is DC so as to deliver a steady radial force inward or outward as needed. The gently delivered deformation is created against the mount comprising the waiting spherical mount for permanent adhesion.

Figure 4B:
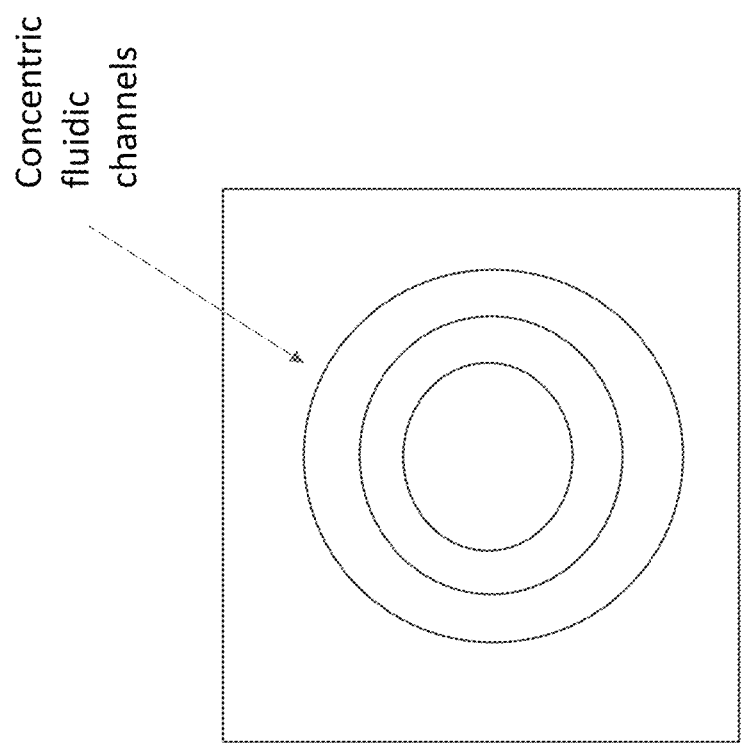

FIGS. 4A and 4B illustrate an example wherein the flexible actuator membrane contains two layers of structures comprising concentric micro-fluidic channels. In the example of FIG. 4A, the pressure is adjusted so that the fluidic channels in the outer layer (furthest from the detector membrane) expand while the channels in the inner layer (closest to the detector membrane) contract, so as to form the curved surface. In one example, the PDMS polymer of the micro fluidic structure is stretchy and expands under pressure. Adjusting the pressure (or vacuum) in each layer generates a gentle curving force against the attached detector membrane. FIG. 4C shows the evolution of CCD flatness using pressure conforming and FIG. 4D shows the evolution of flatness using vacuum conforming. FIG. 4E shows the resulting detector array mounted on a curved substrate.

Figure 5:
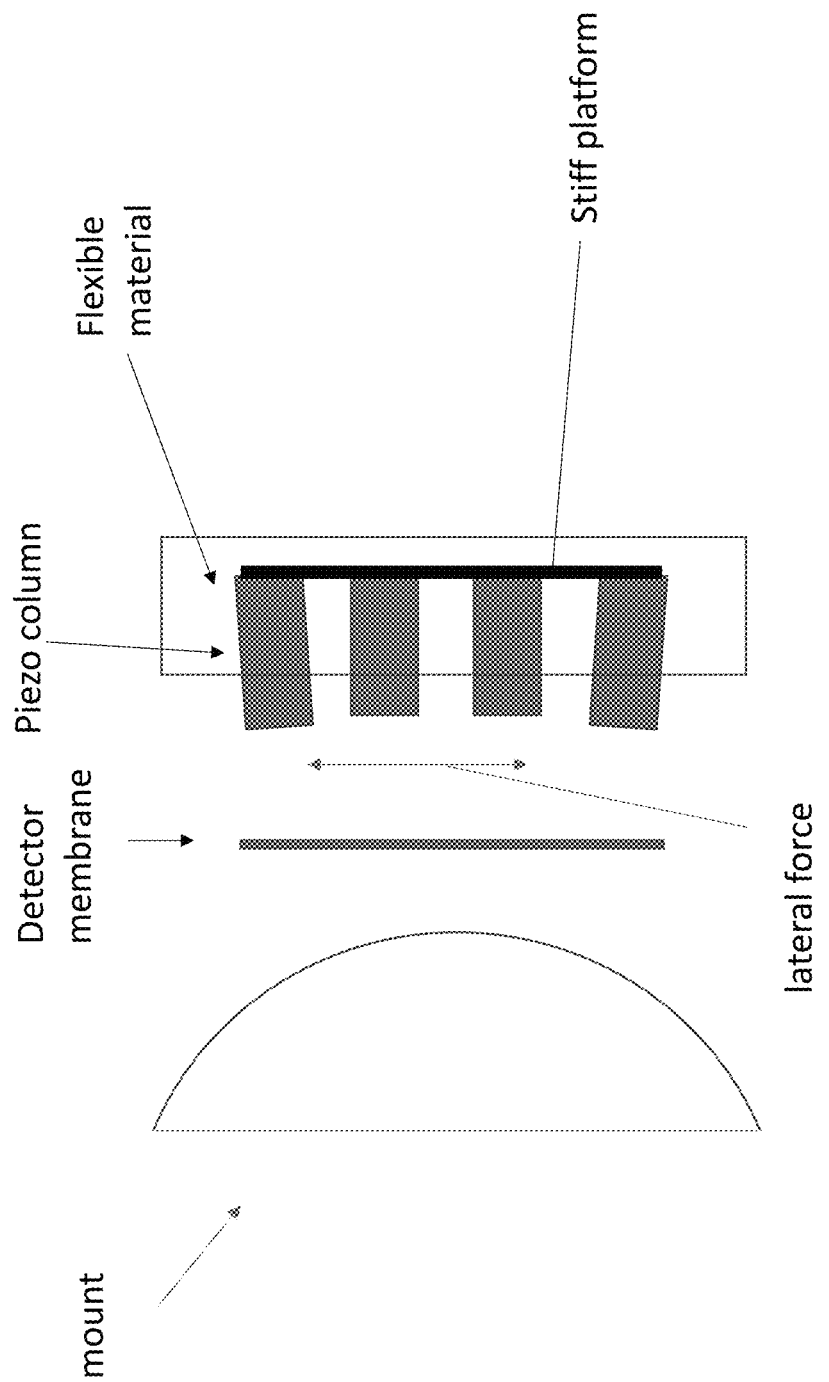
FIG. 5. Schematic illustrating the apparatus for making a curved imager using piezo actuators.

FIG. 5 illustrates an example wherein the structures delivering a steady deliberate force comprise concentrically arrayed piezo electric actuators. The piezos are set against a stiff disk at one of their ends and are softly attached to the detector membrane at the other. There is sufficient flexible material between the piezos to allow the piezos to tilt laterally during their longitudinal deformations.

Figure 6A:
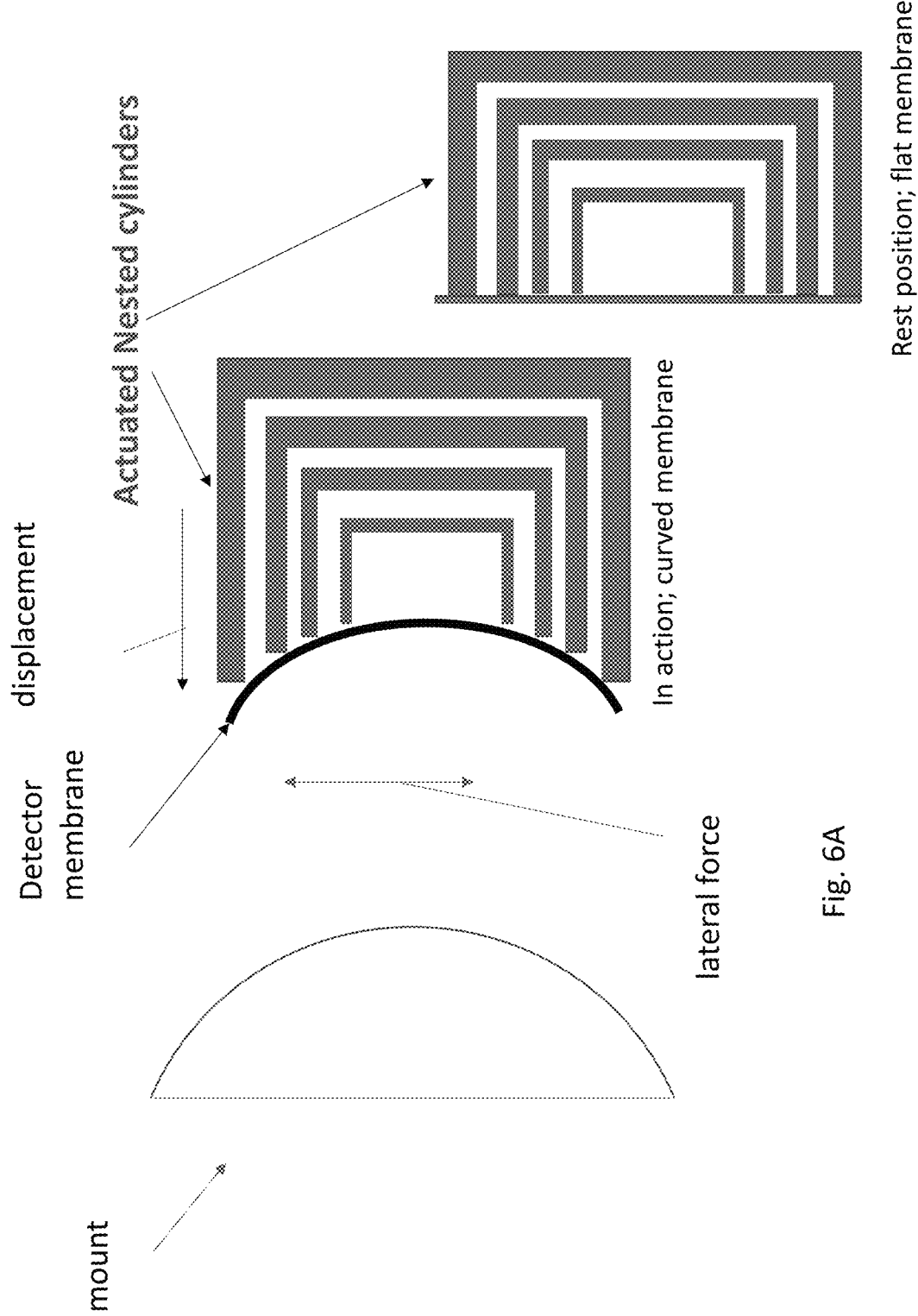
Figure 6B:
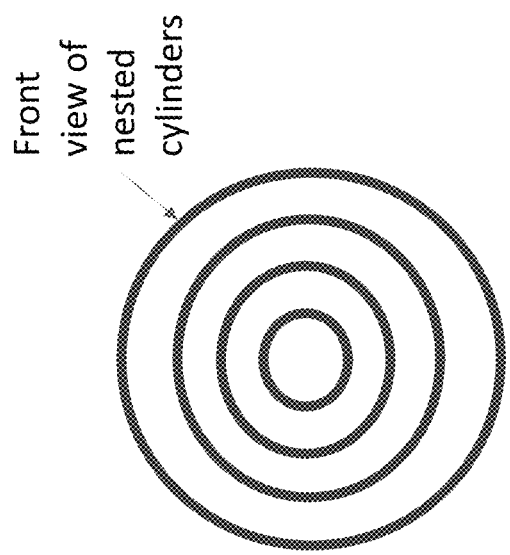
Figure 6C:
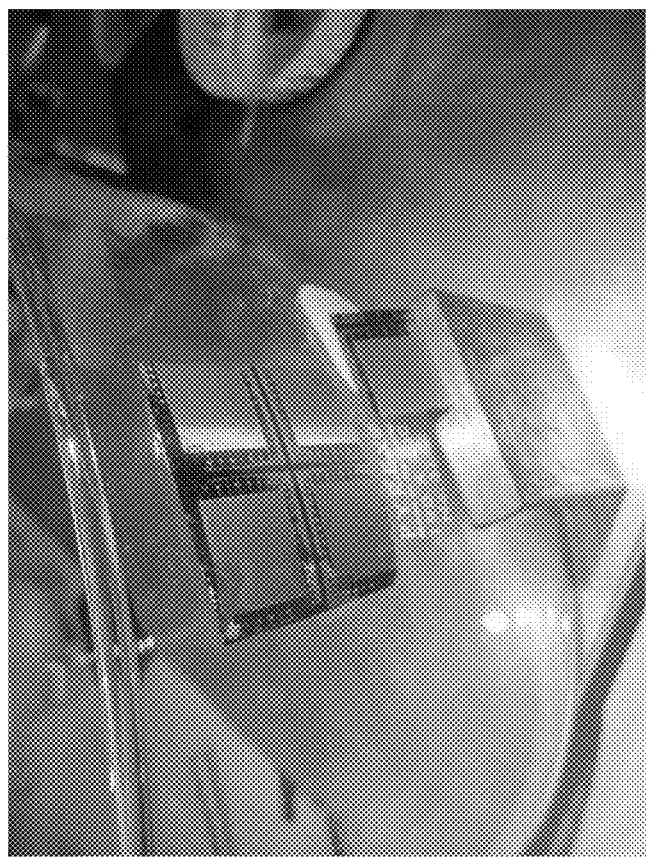

FIG. 6A illustrates an example comprising softly attaching the structures comprising a nested set of concentric cylinders which can be acted upon with gentle force at one end and allowed to deform the detector membrane with increasing extent with larger radius of cylinder. This method can benefit from having a contrasting set of cylinders on the opposite side of the detector membrane. Especially unique to this approach would be making the assembly so the contact to the detector membrane is nearly frictionless. This allows the membrane to adjust laterally to its natural minimum of stored mechanical energy. FIG. 6B a top view of the nested cylinders and FIG. 6C shows attachment of an imager to a cylindrical backing.

Figure 7:
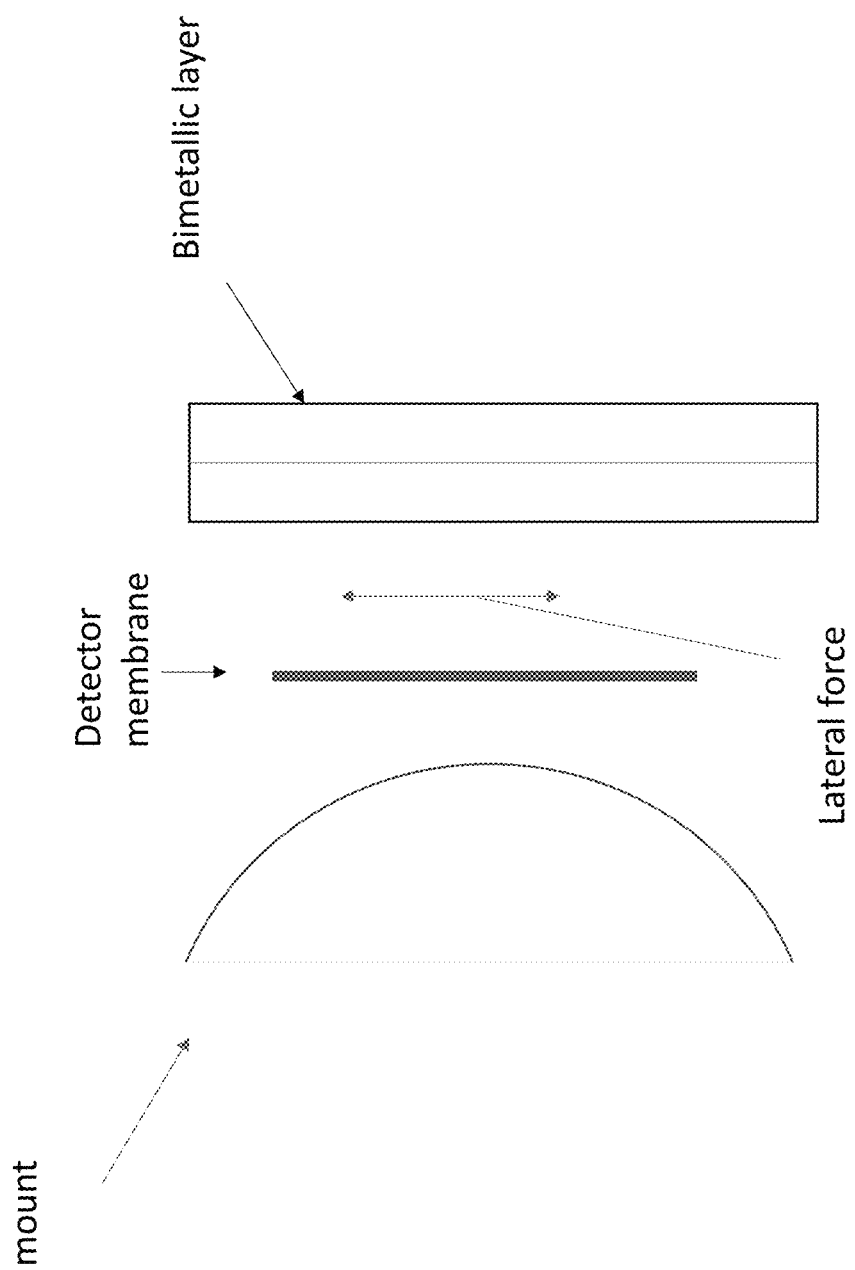
FIG. 7. Schematic illustrating the apparatus for making a curved imager using bimetallic layers.

FIG. 7 illustrates example attaching a custom bi-metallic plate which deforms to a known degree of curvature for each temperature the plate is exposed to.

Figure 8:
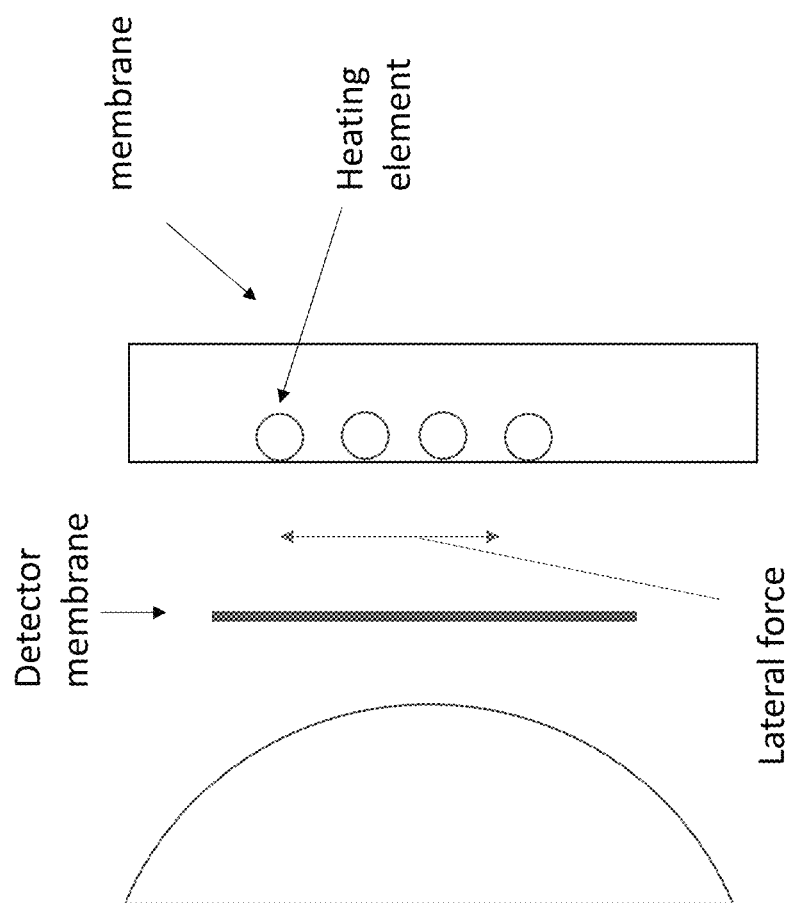
FIG. 8. Schematic illustrating the apparatus for making a curved imager using heating elements.

FIG. 8 illustrates an example wherein the structure comprises heating elements sequentially heating or cooling the detector membrane during its gradual application to a waiting spherical mount. The apparatus seizes the membrane upon the mount (e.g., a sphere) when the detector membrane is thermally stressed to the optimal strain for the given region of contact.

Figure 9:
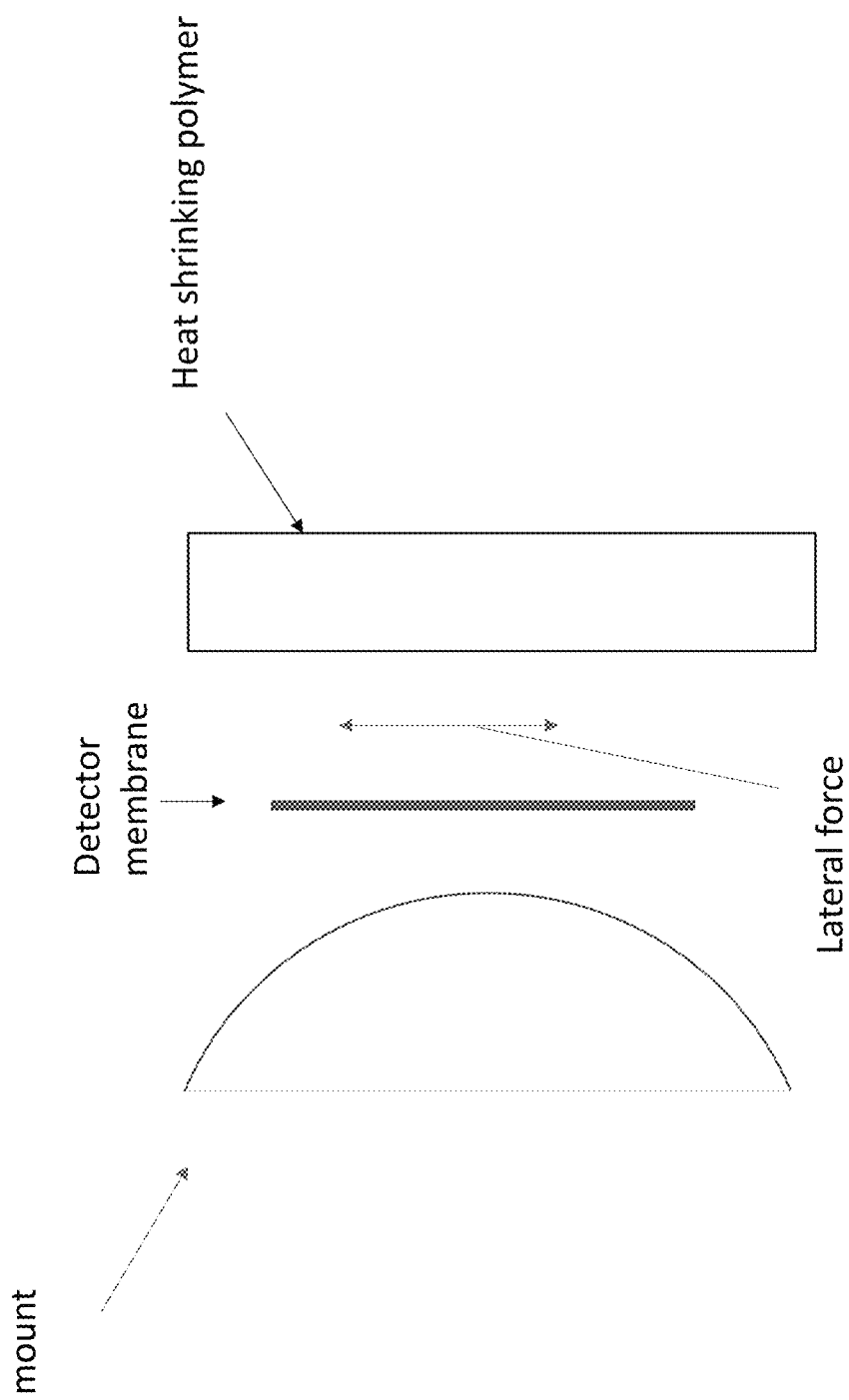
FIG. 9. Schematic illustrating the apparatus for making a curved imager using heat shrinking polymer.

FIG. 9 illustrates another approach comprising applying a heat shrinking polymer (e.g., polyolefin, PVC, polyethylene, polypropylene) and warming, to various degrees, only those regions of the detector array having a specified radius from the center of the array.

FIG. 10 illustrates freestanding thinned membrane comprising 1000×1000 pixel CCDs curved to different curvatures using air pressure. The CCD was taken from essentially flat configuration to ~250 mm radius of curvature (ROC) with no observed mechanical damage.

In one or more examples, a combination of the above described methods can be used to simultaneously act upon the detector membrane and produce the final curvature.

Strain Modeling

In one or more examples, the manufacturing uses a model of the expected strain of a spherically curved detector membrane when it has been deformed by purely orthogonal forces. The analysis includes consideration of creating less strain (than is created using orthogonal forces) by means of lateral forces in the plane of the detector membrane. As described herein, the method can include applying lateral force in the progression from flat to final curve and progressively seizing the membrane as the radius of contact increases, so as to form the detector membrane into a final artificial state of strain distribution lower that its natural state by virtue of the adhesive forces which sustain the lateral strain.

Figure 11:
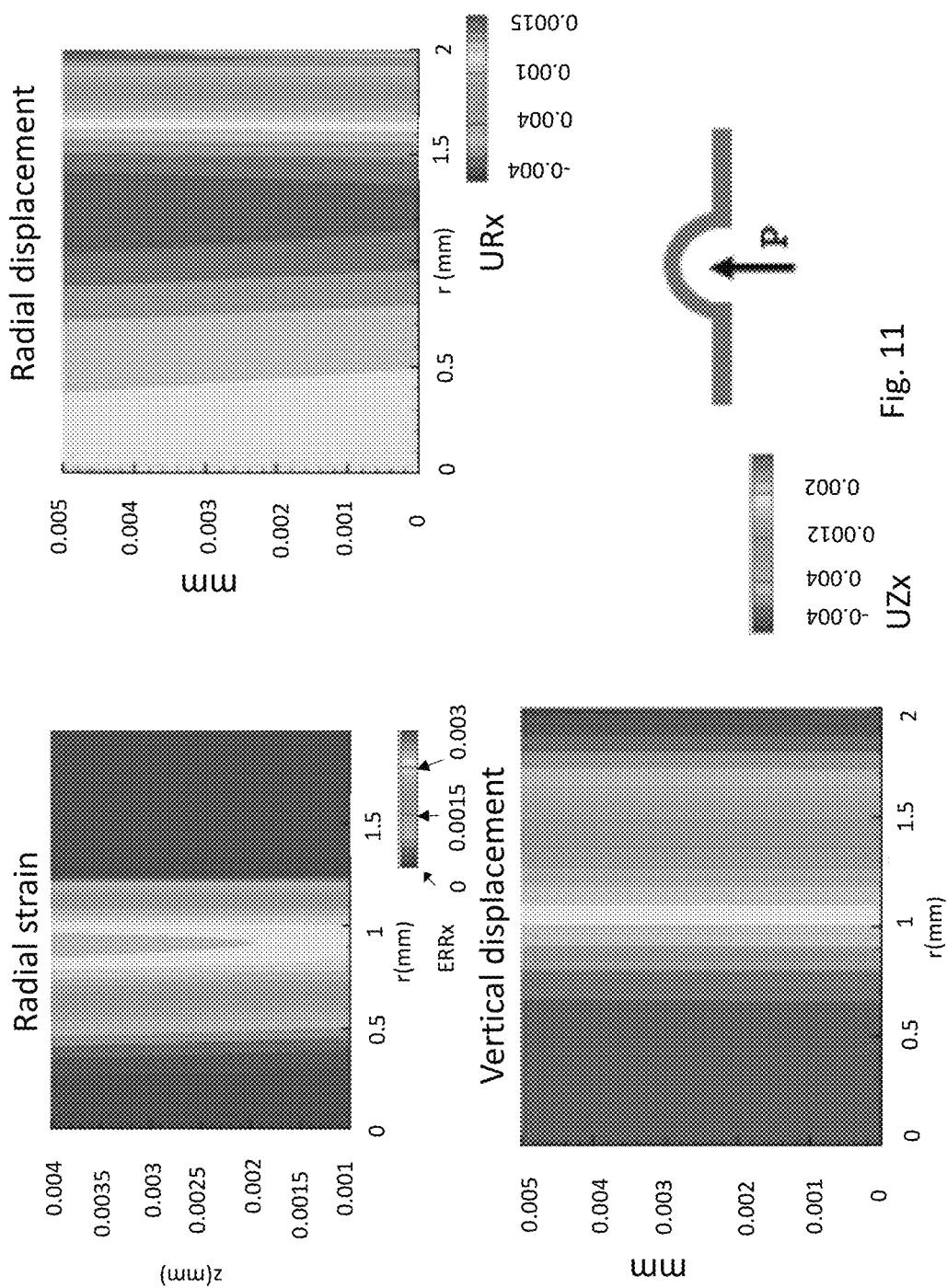
FIG. 11 illustrates results of strain modeling for forming the curved detector membranes using hydrostatic pressure using the apparatus of FIG. 3A.

FIG. 11 illustrates results of strain modeling for forming the curved detector membranes using hydrostatic pressure, for a membrane radius=2 mm, membrane thickness H=5 micrometers, and an applied pressure=5*Young modulus, e.g., using the apparatus of FIG. 3A.

Figure 12:
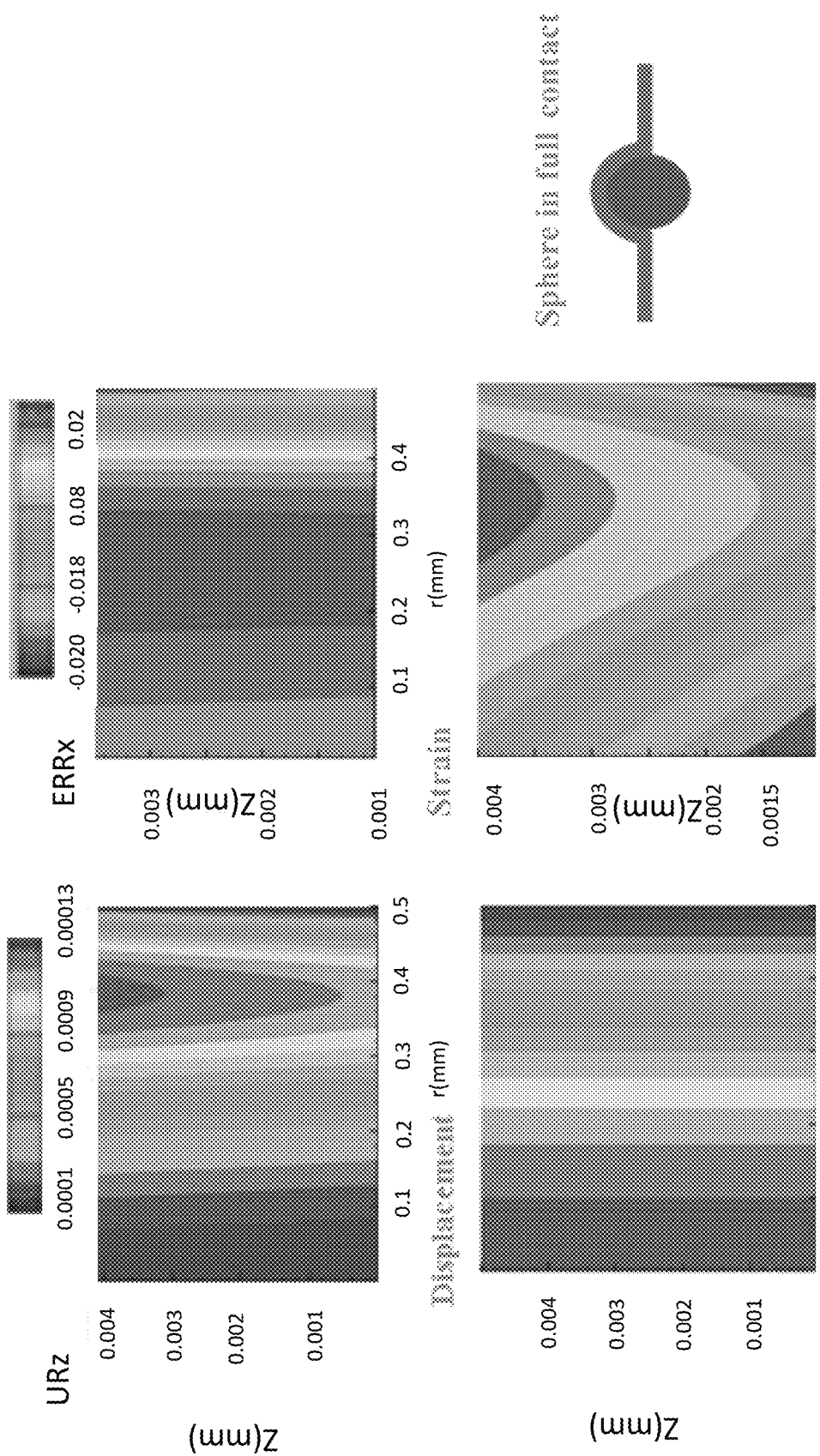
FIG. 12 illustrates results of strain modeling for forming the curved detector membrane using a full contact with as sphere using the apparatus of FIG. 6B.

FIG. 12 illustrates results of strain modeling for forming the curved detector membrane using a full contact with as sphere, for a membrane radius=2 mm, membrane thickness H=5 micrometers.

Figure 13:
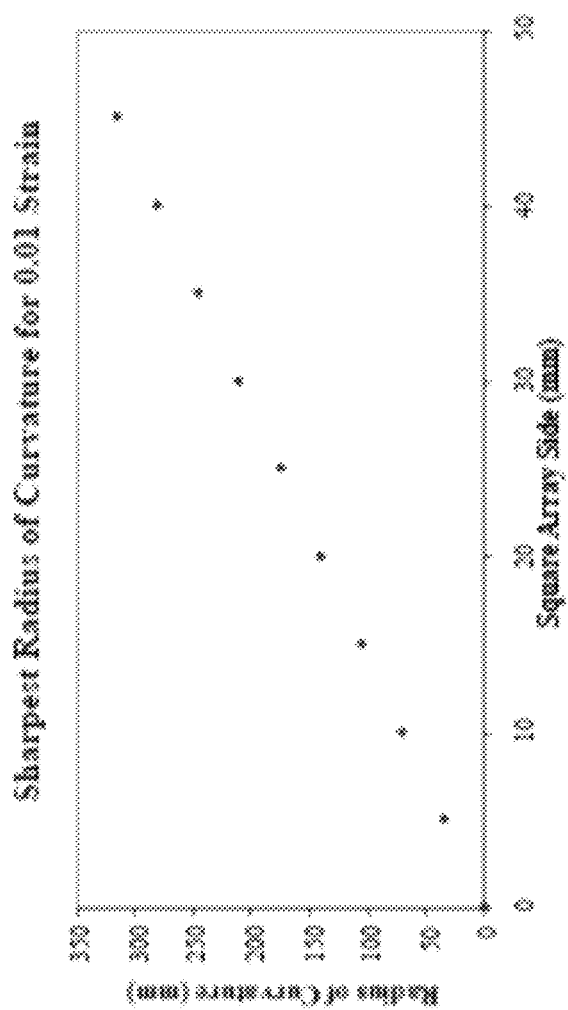
FIG. 13 plots sharpest radius of curvature as a function of square array side such that strain is 0.01.

FIG. 13 illustrates an example of conforming a thinned silicon detector membrane by mapping a square array onto a spherical substrate and plotting the sharpest radius of curvature (ROC) for a given area to maintain 0.01 (1%) strain. This strain allows staying well below the ideal elastic limit of silicon which is theoretically 17% (Reference: D. Roundy, M. L. Cohen, Ideal strength of diamond, Si, and Ge. Phys. Rev. B 64, 212103 (2001), incorporated by reference herein). Under this strain as shown in FIG. 13, smaller arrays accommodate tighter ROCs, larger arrays require gentler ROCs. By taking advantage of the less conservative silicon elastic limit of 17%, even monolithic detectors can accommodate smaller ROCs. Clearly, mosaicking multiple detectors can also accommodate a larger range of ROCs. Methods described herein allow the application of higher strain up to the elastic limit (e.g., in the range of 0.01-17%).

Contacting the Membranes

Various methods for softly contacting and mounting the detector membranes can be used. In one example, the mount progressively attaching to the detector membrane comprises naturally clingy polymers or UV cure epoxies patterned with delicate fingers or 'spider webs' that seize the detector membrane. The transition from thinning of a thick detector stack or 'sandwich' to curving the thinned detector membrane may also involve a strategic release of the detector membrane from a rigid substrate over to a flexible carrier.

Figure 14:
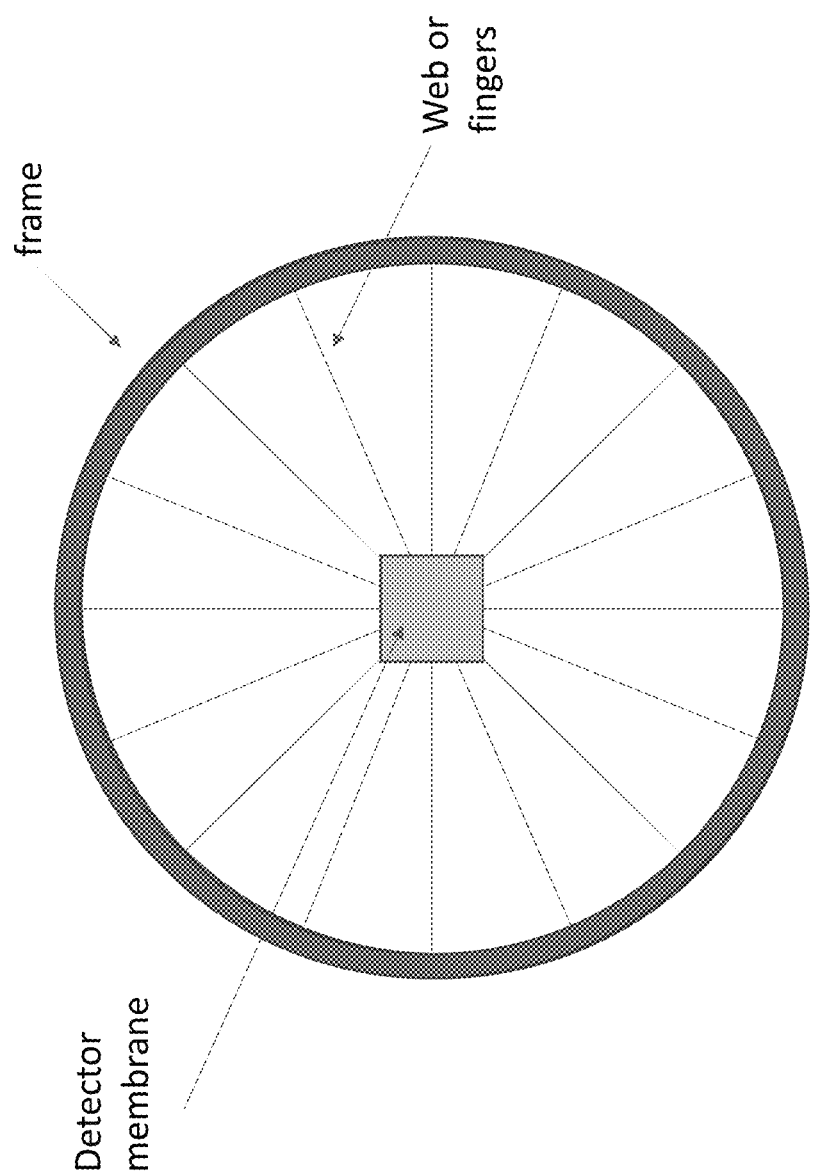
FIG. 14. Frame comprising patterned elastomer for manipulating the detector membrane.

FIG. 14 illustrates a frame supporting an elastomer, the elastomer patterned with fingers or a web and the fingers or the web providing a reversible soft contact between the detector membrane and the frame. The frame is used to progressively attach the detector membrane to the mount and/or manipulate the detector membrane while the detector membrane is being deformed using one or more different methods (including one or more of, or a combination of the methods) described herein (see e.g., methods of FIG. 2-10).

In one or more examples, the frame and elastomer is fabricated by (a) depositing the elastomer on the detector membrane; and (b) lithographically patterning the elastomer with the web or finger structures, wherein the patterned elastomer is supported in a frame.

In various examples, the fingers or web comprise a polymer (e.g., UV curable epoxy, PVA poly vinyl acetate).

Detector Characterization

Figure 15A:
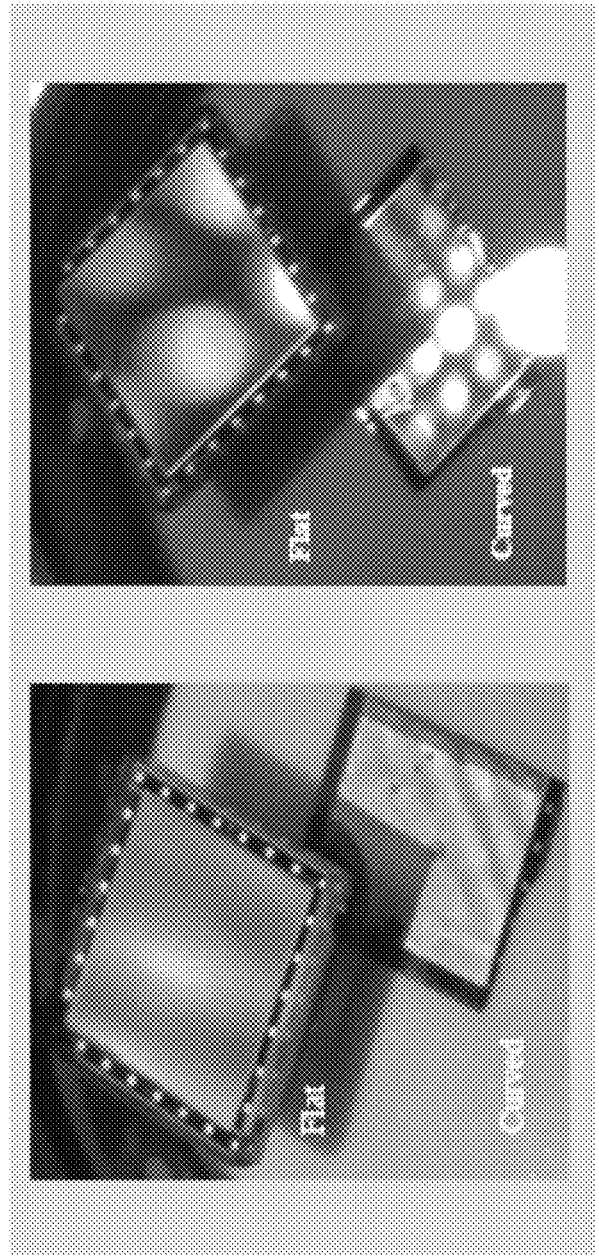

FIG. 15A illustrates a 1000×1000 pixel, 12 μm thick detector membrane comprising CCDs attached to curved substrates and having a ROC=250 mm. The freestanding detector membranes curved using air pressure. For comparison, FIG. 15A also illustrates the same CCD formats attached to flat substrates. The change in diffraction pattern observed on the detector surfaces evidences the spherical curvature. FIG. 15B illustrates the structure of the detector membrane comprises CCDs (silicon p-n junctions) and a delta doped layer near the surface receiving the photons (for passivation).

Figure 16B:
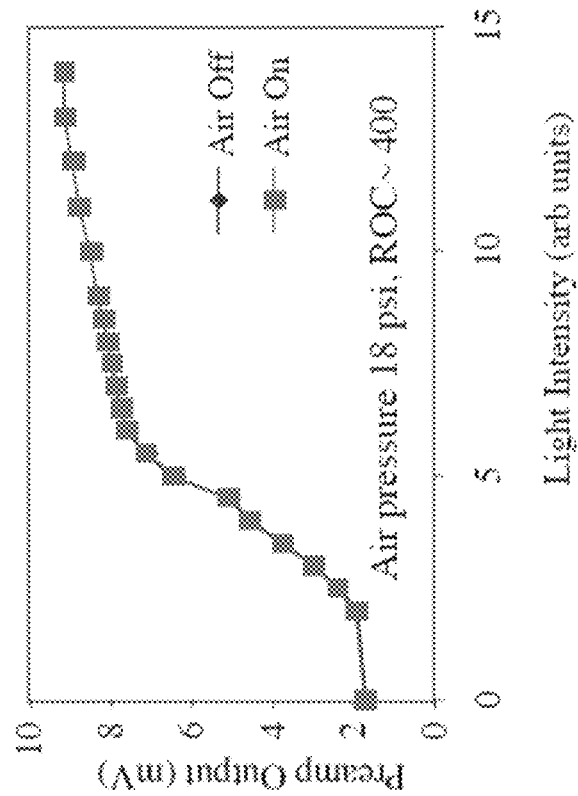
FIG. 16A-16C plots the performance of the curved detectors of FIG. 15, for ROC of 500 mm (FIG. 16A), 400 mm (FIG. 16B) and 250 mm (FIG. 16C).
Figure 16A:
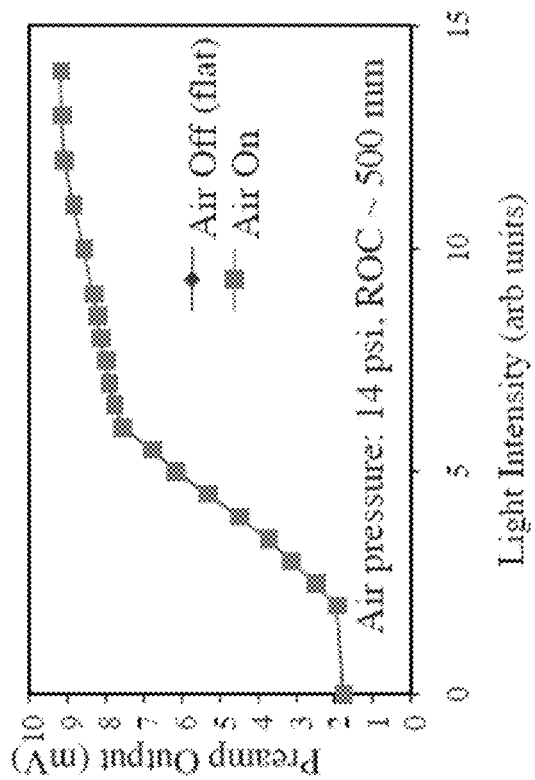
Figure 16C:
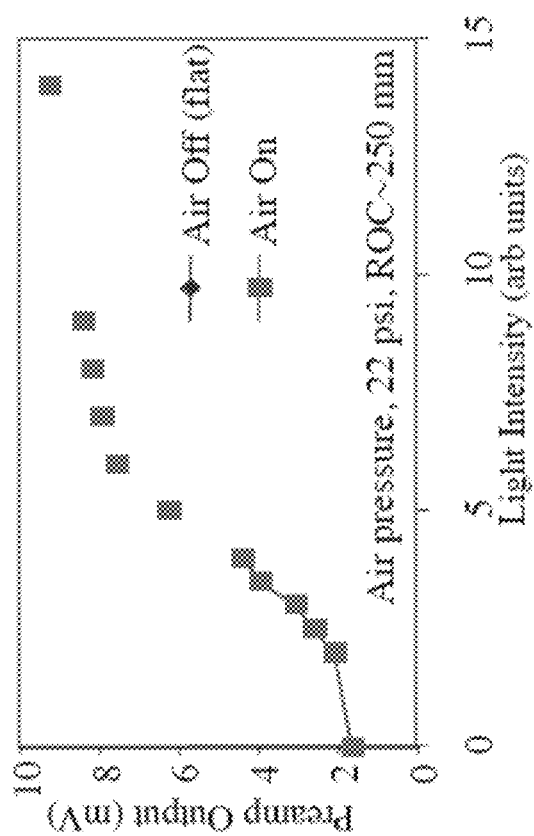

The curved focal plane arrays (CFPA) of FIG. 15A were operated and output current was measured as a function light intensity for CFPAs with three different radius of curvature (ROC), as shown in FIG. 16. No change in the signal level or device behavior was observed as a function of curvature.

Applications

Conventional imaging systems produce a flat focal plane wave front in order to be captured by a flat imaging array. However, very simple imaging optics produce non-planar focal surfaces. If the imaging detector can be shaped to the non-planar focal surface, as described herein, then there is no need for complicated optics. The savings in cost, size, and mass of the optical system enables new applications of the imaging system.

Furthermore, the curved detector array enables a larger field of view and reduces aberrations such as astigmatism and coma, and increases peripheral brightness and sharpness. In the natural world mammalian eyes exhibit the value the design: simple lens and curved retina.

For space applications, the curved detector array enables lighter and more compact cameras for satellites and rovers. Imaging systems using a compact curved detector manufactured using processes described herein can be used for wearable IR imaging and low mass and volume systems. Examples include, but are not limited to, consumer cameras and smart phones, and headwear for the military and firefighters.

Device and Method Embodiments

Devices and methods according to embodiments described herein include, but are not limited to, the following.

1. FIG. 1B illustrates a detector, comprising:
a detector membrane comprising a semiconductor sensor and a readout circuit, the detector membrane having a thickness of 100 micrometers or less and a curved surface conformed to a curved focal plane of an optical system imaging electromagnetic radiation onto the curved surface; and
a mount attached to a backside of the detector membrane; wherein:
a maximum of the strain experienced by the detector membrane is reduced by distribution of the strain induced by formation of the curved surface across all of the curved surface of the detector membrane, thereby allowing an increased radius of curvature of the curved surface, and
the semiconductor sensor converts photons to charged particles and the readout circuit measures a quantity of the charged particles, the semiconductor comprises an elemental semiconductor or compound semiconductor, and the readout circuit is integrated with semiconductor sensor monolithically or in a hybrid fashion.

2. The detector of example 1, wherein an adhesion between the mount and the detector membrane distributes the strain.

3. The detector of example 1 or 2, wherein the semiconductor comprises silicon or a group III-V semiconductor, II-VI semiconductor, and the focal plane array detects electromagnetic radiation having a wavelength in a range of 400 nm-16 microns.

4. The detector of example 1, 3, or 4 wherein:
the detector membrane has a radius of curvature of 50 mm or less, and
the curved surface has an area receiving electromagnetic radiation of at least 400 millimeters.

5. The detector of one or any combination of the examples 1-4, wherein the curved surface is spherical, parabolic, elliptical, or custom designed shape.

6. A wearable infrared imager or a camera comprising the detector of any of the examples 1-5.

7. A detector, comprising:
a detector membrane comprising a semiconductor sensor and a readout circuit, the detector membrane having a thickness of 100 micrometers or less and a curved surface conformed to a curved focal plane of an optical system imaging electromagnetic radiation onto the curved surface; wherein:
the semiconductor sensor converts photons to charged particles and the readout circuit measures a quantity of the charged particles, the semiconductor comprises an elemental semiconductor or compound semiconductor and the readout circuit is integrated with semiconductor sensor monolithically or in a hybrid fashion;
the detector membrane a radius of curvature of 50 mm or less; and
the curved surface has an area of at least 400 millimeters squared.

8. FIG. 2-FIG. 10 illustrate a method of making a curved detector, comprising:
obtaining a detector membrane comprising a semiconductor having a thickness less than 100 microns;
applying one or more forces at a plurality of locations on the detector membrane and in one or more directions, the one or more forces deforming the detector membrane so as to form a curved surface of the detector membrane, wherein:
the forces applied in one direction are applied a frictionless manner (or substantially frictionless manner) with no friction (or substantially no friction) between the detector membrane and the actuator applying the forces, or when the one or more directions include a plurality of directions, the directions include one or more lateral directions in a tangential plane of a surface of the detector membrane;

progressively attaching the detector membrane to a mount as the forces are applied so that the mount sustains or supports a majority of the strain, wherein the detector membrane is adhered to an adhesive on a surface of the mount, the surface having the desired/designed/target radius of curvature of the curved surface.

9. The method of example 8, further comprising physically contacting the detector membrane to a flexible actuator membrane generating the forces and applying the one or more forces to the detector membrane via a physical contact between the actuator membrane and the detector membrane.

11. FIG. 3A illustrates the method of example 9, wherein: the flexible actuator membrane comprises a plurality of concentric conductors in a plane of the flexible actuator membrane, and applying the forces comprises:

passing an electrical current in the conductors, and applying a magnetic field to induce a Lorentz force on the conductors that laterally stretches or contracts the flexible actuator membrane, thereby delivering through the physical contact the one or more forces comprising a radial force inwards or outwards.

11. FIG. 4A illustrates the method of example 9, wherein: the flexible actuator membrane comprises two layers each including a plurality of concentric fluidic channels in a plane of the flexible actuator membrane; and applying the forces comprises controlling a pressure of a fluid in the fluidic channels causing the flexible actuator membrane to expand or contract, thereby delivering through the physical contact the one or more forces comprising a radial force inwards or outwards.

12. FIG. 7 illustrates the method of example 8, further comprising:

physically contacting the detector membrane with a flexible actuator or flexible actuator membrane (e.g., bimetallic plate) comprising at least two materials having different coefficients of thermal expansion; and heating and/or cooling the flexible actuator membrane to a plurality of temperatures causing the bimetallic plate to deform and applying the one or more forces to the detector membrane via a physical contact between the bimetallic plate and the detector membrane.

13. FIG. 8 illustrates the method of example 8, wherein applying the forces comprises sequentially heating or cooling the detector membrane while progressively attaching the detector membrane to the mount having the desired radius of curvature, so as to seize the detector membrane upon the surface of the mount when the detector membrane is thermally stressed to an optimal strain for a given region of contact between the detector membrane and the mount.

14. FIG. 9 illustrates the method of example 8, further comprising applying a heat shrinking polymer to the detector membrane, wherein applying the forces comprises warming, to various degrees, only those regions of the detector membrane of specified radius from the center of the detector membrane.

15. FIG. 5 illustrates the method of example 8, further comprising applying the one or more forces using concentrically arrayed piezo electric actuators on a flexible material, wherein:

the piezo electric actuators are set against a stiff platform at one end opposite the detector membrane and are attached to the detector membrane at the other of their ends, and the flexible material between the piezo electric actuators allows the piezo electric actuators to tilt laterally during their longitudinal deformations.

16. FIG. 6A illustrates the method of example 8, further comprising:

physically contacting a nested set of concentric cylinders to the detector membrane, the cylinders each having a different radius; and displacing each of the cylinders against the detector membrane so that the cylinders transfer the one or more forces deforming the detector membrane with increasing extent with larger radius of cylinder.

17. The method example 16, wherein the nested cylinders are gradually displaced with a curved profile.

18. FIG. 14 illustrates the method of example 8 further comprising progressively attaching the detector membrane to the mount using a frame supporting an elastomer, the elastomer patterned with fingers or a web and the fingers or the web providing a reversible soft contact between the detector membrane and the frame.

19. The method of example 18, further comprising:

(a) depositing the elastomer on the detector membrane;

(c) lithographically patterning the elastomer with the web or finger structures, wherein the patterned elastomer is supported in a frame; and 20. The method of any of the examples 8-18 further comprising manipulating the detector membrane using the frame while the detector membrane is being deformed using one or more different methods.

21. The method of example 7, wherein the curved surface is formed using a combination of the methods of examples 8-18.

22. FIG. 2 illustrates an apparatus, comprising:

an actuator having structures (e.g., piezo actuators, concentric conductors, fluidic channels, nested cylinders) positioned to apply one or more forces at a plurality of locations on the detector membrane and in one or more directions, the one or more forces deforming the detector membrane so as to form a curved surface of the detector membrane, wherein:

the forces applied in one direction are applied a frictionless manner with no friction between the detector membrane and the actuator applying the forces, or when the one or more directions include a plurality of directions, the directions include one or more lateral directions in a tangential plane of a surface of the detector membrane; and a mount positioned to progressively attach to the detector membrane as the forces are applied so that the mount sustains or supports a majority of a strain induced in the detector membrane by the forces, wherein the detector membrane is attached to a surface of the mount having a radius of the curved surface.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of making a curved detector, comprising:
obtaining a detector membrane comprising a semiconductor having a thickness less than 100 microns;
applying one or more forces at a plurality of locations on the detector membrane and in one or more directions, the one or more forces deforming the detector membrane so as to form a curved surface of the detector membrane, wherein:
the forces applied in one direction are applied in a frictionless manner with no friction between the detector membrane and an actuator applying the forces, or
when the one or more directions include a plurality of directions, the directions include one or more lateral directions in a tangential plane of a surface of the detector membrane;
progressively attaching the detector membrane to a mount as the forces are applied so that the mount sustains or supports a majority of a strain, wherein the detector membrane is adhered to an adhesive on a surface of the mount, the surface having the desired/designed/target radius of curvature of the curved surface.

2. The method of claim 1, further comprising physically contacting the detector membrane to a flexible actuator membrane generating the forces and applying the one or more forces to the detector membrane via a physical contact between the actuator membrane and the detector membrane.

3. The method of claim 2, wherein:
the flexible actuator membrane comprises a plurality of concentric conductors in a plane of the flexible actuator membrane, and
applying the forces comprises:
passing an electrical current in the conductors, and
applying a magnetic field to induce a Lorentz force on the conductors that laterally stretches or contracts the flexible actuator membrane, thereby delivering through the physical contact the one or more forces comprising a radial force inwards or outwards.

4. The method of claim 2, wherein:
the flexible actuator membrane comprises two layers each including a plurality of concentric fluidic channels in a plane of the flexible actuator membrane; and
applying the forces comprises controlling a pressure of a fluid in the fluidic channels causing the flexible actuator membrane to expand or contract, thereby delivering through the physical contact the one or more forces comprising a radial force inwards or outwards.

5. The method of claim 1, further comprising:
physically contacting the detector membrane with a flexible actuator membrane comprising a bimetallic plate comprising at least two materials having different coefficients of thermal expansion; and
heating and/or cooling the flexible actuator membrane to a plurality of temperatures causing the bimetallic plate to deform and applying the one or more forces to the detector membrane via a physical contact between the bimetallic plate and the detector membrane.

6. The method of claim 1, wherein applying the forces comprises sequentially heating or cooling the detector membrane while progressively attaching the detector membrane to the mount having the desired radius of curvature, so as to seize the detector membrane upon the surface of the mount when the detector membrane is thermally stressed to an optimal strain for a given region of contact between the detector membrane and the mount.

7. The method of claim 1, further comprising applying a heat shrinking polymer to the detector membrane, wherein applying the forces comprises warming, to various degrees, only those regions of the detector membrane of specified radius from the center of the detector membrane.

8. The method of claim 1, further comprising applying the one or more forces using concentrically arrayed piezo electric actuators on a flexible material, wherein:
the piezo electric actuators are set against a stiff platform at one end opposite the detector membrane and are attached to the detector membrane at the other of their ends, and
the flexible material between the piezo electric actuators allows the piezo electric actuators to tilt laterally during their longitudinal deformations.

9. The method of claim 1, further comprising:
physically contacting a nested set of concentric cylinders to the detector membrane, the cylinders each having a different radius; and
displacing each of the cylinders against the detector membrane so that the cylinders transfer the one or more forces deforming the detector membrane with increasing extent with larger radius of cylinder.

10. The method claim 9, wherein the nested cylinders are gradually displaced with a curved profile.

11. The method of claim 1, further comprising progressively attaching the detector membrane to the mount using a frame supporting an elastomer, the elastomer patterned with fingers or a web and the fingers or the web providing a reversible soft contact between the detector membrane and the frame.

12. The method of claim 1, further comprising:
(a) depositing an elastomer on the detector membrane; and
(b) lithographically patterning the elastomer with web or finger structures, wherein the patterned elastomer is supported in a frame.

13. The method of claim 12, comprising manipulating the detector membrane using the frame while the detector membrane is being deformed using one or more different methods.

14. An apparatus, comprising:
an actuator having structures positioned to apply one or more forces at a plurality of locations on the detector membrane and in one or more directions, the one or more forces deforming the detector membrane so as to form a curved surface of the detector membrane, wherein:
the forces applied in one direction are applied in a frictionless manner with no friction between the detector membrane and an actuator applying the forces, or
when the one or more directions include a plurality of directions, the directions include one or more lateral directions in a tangential plane of a surface of the detector membrane; and
a mount positioned to progressively attach to the detector membrane as the forces are applied so that the mount sustains or supports a majority of a strain induced in the detector membrane by the forces, wherein the detector membrane is attached to a surface of the mount having a radius of the curved surface.

15. The apparatus of claim 14, wherein the actuator comprises a flexible actuator membrane generating the forces and applying the one or more forces to the detector membrane via a physical contact between the actuator membrane and the detector membrane.

16. The apparatus of claim 15, wherein:
the flexible actuator membrane comprises a plurality of concentric conductors in a plane of the flexible actuator membrane, and
applying the forces comprises:
passing an electrical current in the conductors, and
applying a magnetic field to induce a Lorentz force on the conductors that laterally stretches or contracts the flexible actuator membrane, thereby delivering through the physical contact the one or more forces comprising a radial force inwards or outwards.

17. The apparatus of claim 15, wherein:
the flexible actuator membrane comprises two layers each including a plurality of concentric fluidic channels in a plane of the flexible actuator membrane; and
applying the forces comprises controlling a pressure of a fluid in the fluidic channels causing the flexible actuator membrane to expand or contract, thereby delivering through the physical contact the one or more forces comprising a radial force inwards or outwards.

18. The apparatus of claim 15, further comprising:
the flexible actuator membrane comprising a bimetallic plate comprising at least two materials having different coefficients of thermal expansion so that heating and/or cooling the flexible actuator membrane to a plurality of temperatures causes the bimetallic plate to deform and applying the one or more forces to the detector membrane via a physical contact between the bimetallic plate and the detector membrane.

19. The apparatus of claim 15, wherein:
the actuator comprises concentrically arrayed piezo electric actuators on a flexible material, wherein:
the piezo electric actuators are set against a stiff platform at one end opposite the detector membrane and are attached to the detector membrane at the other of their ends, and
the flexible material between the piezo electric actuators allows the piezo electric actuators to tilt laterally during their longitudinal deformations; or
the actuator comprises a nested set of concentric cylinders, the cylinders each having a different radius, so that displacing each of the cylinders against the detector membrane transfers the one or more forces deforming the detector membrane with increasing extent with larger radius of cylinder.

20. The apparatus claim 14, further comprising a frame supporting an elastomer for progressively attaching the detector membrane to the mount, the elastomer patterned with fingers or a web and the fingers or the web providing a reversible soft contact between the detector membrane and the frame.

* * * * *